Sept. 3, 1968 J. LETTIERI 3,400,280

HIGH SPEED ASTABLE/MONOSTABLE DEVICE

Filed March 28, 1961

INVENTOR
JOHN LETTIERI

BY

Wesley De Bruin

ATTORNEY

United States Patent Office 3,400,280

Patented Sept. 3, 1968

3,400,280

HIGH SPEED ASTABLE/MONOSTABLE DEVICE

John Lettieri, Modena, N.Y., assignor to International Business Machines Corporation, New York, N.Y., a corporation of New York Filed Mar. 28, 1961, Ser. No. 98,575
7 Claims. (Cl. 307—286)

This invention relates to high speed oscillators employing a minimum number of solid state components. More particularly, this invention is directed to astable and monostable devices, the outputs of which respectively possess fast rise and fall times. Further, the devices are characterized by employing only a single Esaki or tunnel diode and a single transistor.

Circuit development in the digital computer field is becoming increasing directed towards the problem of speed with high reliability of operation. As logical techniques and programming theories advance, increases in operating speeds of the machine itself are required to render operation of the computer more versatile and less expensive. The quest for increased speed narrows itself down in part to the basic blocks out of which the machines are fabricated. Any speed increase achieved at this level is multiplied innumerable times when extrapolated over the entire machine operation.

Many present day computers are practically all solid state, most of the active elements being of the semi-conductor or magnetic core type. Transistors and diodes are used to provide the switching elements required in the logical circuitry of the machine, while magnetic cores are more generally used for storage and memory purposes. The transistor, when used as a switch, as is the case in logical circuitry, suffers from internal speed limitations. For example, in a junction transistor a finite time is required for minority carriers to cross the base region and start collector current flow once the emitter-base diode is forward biased. The same problem occurs in reverse when the transistor is subsequently biased into non-conduction; it takes a finite time for the minority carriers already in the base region to be "cleaned up." Attempts to reduce these turn-on and turn-off delays have followed two avenues; the internal make-up of the transistor has been varied in an attempt to reduce the transit time through the base region, and other efforts have been devoted toward modifying external circuitry to prevent or compensate for this delay. The present invention is in the latter area and enables presently available transistors to be used in logical blocks operating at speeds heretofore not achieved.

Accordingly, it is a primary object of this invention to provide a highly reliable basic circuit, employing a minmum number of components; said circuit performing its function at an extremely high rate of speed and its output having a fast rise time as well as a fast fall time.

A further object of this invention is to provide a high speed, highly reliable, monostable circuit, employing a minimum number of coponents; the outputs of said monostable circuit having very short duration rise and fall times.

A further object of this invention is to provide a high speed, highly reliable astable circuit, employing a minimum number of components: the output of said astable circuit having very short duration rise and fall times.

An additional object is to provide a high speed, highly reliable monostable circuit whose input is the output of logical circuitry widely employed in the computing art and whose output is within a predetermined voltage range and therefore may be the input to logical circuitry also widely employed in the computing art.

An additional object is to provide a high speed, highly reliable astable circuit whose input is the output of logical circuitry widely employed in the computing art and whose output is within a predetermined voltage range and therefore ma ybe the input to logical circuitry also widely employed in the computing art.

Still another object of this invention is to provide an improved oscillator circuit utilizing a single negative resistance device having the requisite voltage versus current characteristic and a single transistor, and having improved output pulse width stability.

Still another object of this invention is to provide a monostable device utilizing a single tunnel diode and a single transistor, and having improved output pulse width stability.

Still another object of this invention is to provide an astable device utilizing a single tunnel diode and a single transistor, and having improved output pulse width stability.

Briefly, this invention comprises a transistor having a negative resistance device connected between its base and emitter and a series circuit including a unidirectional device and an energy storage device connected across the collector and emitter of said transistor. Said negative resistance device and said series circuit together with an interconnected resistance network and a source of energy serve to render said transistor successively conductive and non-conductive in a rigorously predetermined stable time sequence. Hence, this is an astable circuit. By a predetermined variation in the resistance network the circuit is rendered monostable and an output, the duration of which is very stable in time duration, is obtained under control of an input. The output of both monostable and astable circuits have very fast rise and fall time.

The foregoing and other objects, features and advantages of the invention will be apparent from the following more particular description of preferred embodiments of the invention as illustrated in the accompanying drawings.

Figure 1:
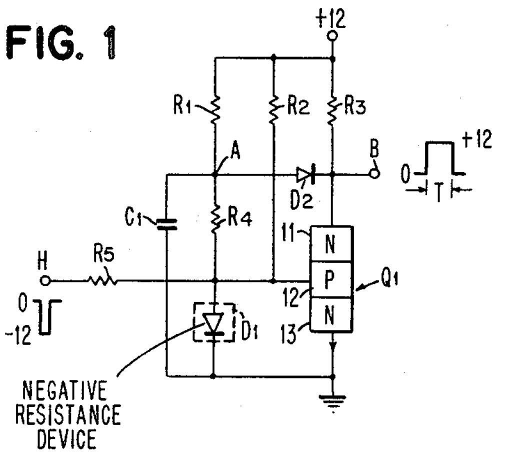
FIGURE 1 is a circuit diagram of a monostable oscillator, or "single-shot" in accordance with the invention.
Figure 3:
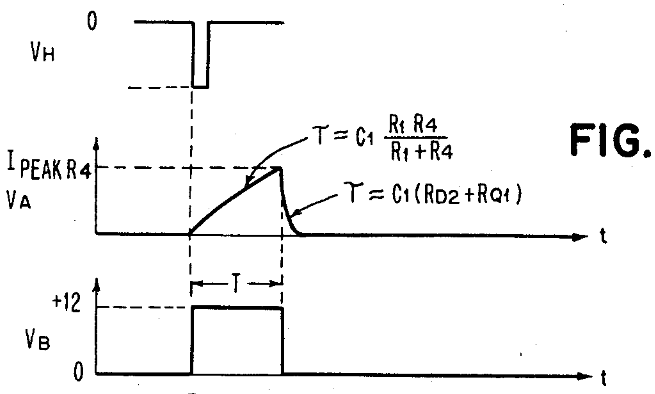

FIGURE 3 discloses three voltage waveforms illustrative of the input ($V_H$) voltage at point A, and the voltage B (output), respectively, of the monostable circuit of FIGURE 1.

Figure 4:
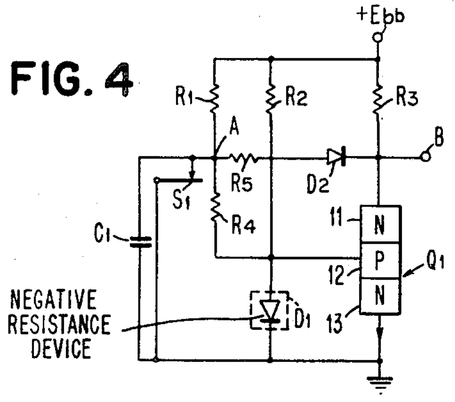

FIGURE 4 disclouses a circuit diagram of an astable or "free running" oscillator in accordance with the invention.

Figure 5:
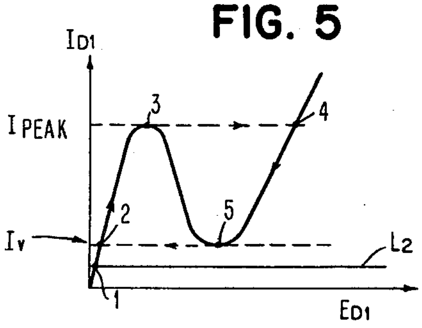

FIGURE 5 is a plot showing the characteristics of the negative resistance element employed in the invention and taken in its entirety is a graphical presentation explanatory of the mode of operation of the astable circuit of FIGURE 4.

Figure 6:
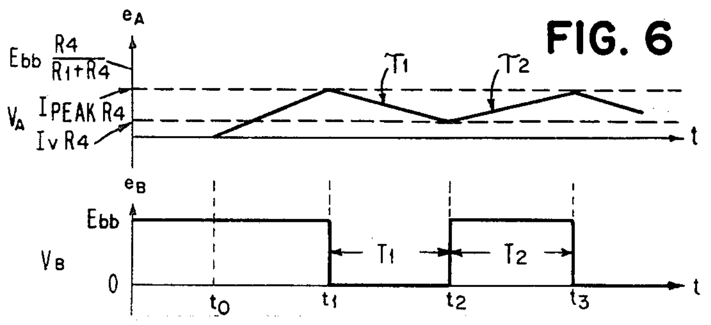

FIGURE 6 discloses two voltage waveforms ($V_A$ and $V_B$) illustrative of the operation of the astable circuit of FIGURE 5.

FIGURE 1 discloses a monostable circuit according to the invention. Transistor $Q_1$ is shown as being of the NPN junction type having an emitter 13, base 12, and collector 11. Negative resistance device $D_1$ is connected between the base 12 and emiter 11 of transistor $Q_1$. The series circuit of diode $D_2$ and resistor $R_4$ is connected between the base 12 and collector 11 of transistor $Q_1$. A capacitor, or energy storage device $C_1$, is connected between the juncture of diode $D_2$ and resistor $R_4$, and emitter 13 of transistor $Q_1$. A source of positive potential is connected via resistor $R_3$ to collector 11 of transistor $Q_1$ and via resistor $R_2$ to base 12 of transistor $Q_1$. A resistor $R_1$ is connected between said source of positive potential and said juncture of diode $D_2$ and resistor $R_4$. The emitter 13 of transistor $Q_1$ is connected to ground or a source of suitable reference potential. An input terminal H is connected via resistor $R_5$ to the base 12 of transistor $Q_1$. An output terminal B is connected to the collector 11 of transistor $Q_1$.

Figure 2:
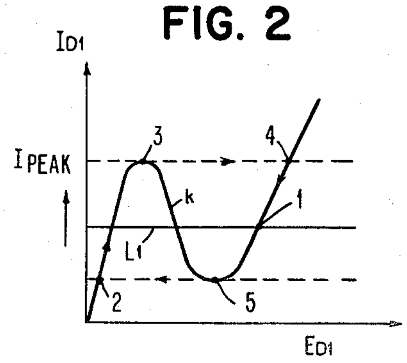
FIGURE 2 is a plot showing the negative resistance characteristic of one element used in the invention and taken in its entirety is a graphical presentation explanatory of the mode of operation of the novel monostable circuit in FIGURE 1.

The current versus voltage characteristics of the negative resistance device $D_1$ employed in the monostable circuit of FIGURE 1 is represented by the curve labelled $k$ in FIGURE 2. This curve passes through labelled points 2, 3, 5, 1, and 4 as seen in FIGURE 2.

One such device which exhibits the current versus voltage characteristic, represented by surve $k$ in FIGURE 2, is the Esaki or tunnel diode. This is a heavily doped junction diode and is therefore exteremely compatible for use in transistor circuits. The negative resistance characteristic is present in its forward conduction direction. A more detailed description of this device may be found in an article by Leo Esaki appearing in the Physical Review for Jan. 15, 1958, entitled "New Phenomenon in Narrow Germanium P–N Junctions," and in the United States patent application of Fred K. Buelow, entitled "High Speed Inverting Circuit," Ser. No. 835,943, filed Aug. 25, 1959. The Buelow patent application and the instant patent application are of common assignee. It will be realized, of course, that any type of device exhibiting the negative resistance characteristic required by the circuit will be suitable.

Reference is made to the graphical presentation of FIGURE 2 in conjunction with the monostable circuit of FIGURE 1. The "quiescent" or stable state of the monostable circuit is represented by point 1 of FIGURE 2. Operating point one is the intersection of load $L_1$ and curve $k$ (current versus voltage characteristic of negative resistance device $D_1$). Load line $L_1$ is obtained by employing a suitable value of $R_2$. When the circuit of FIGURE 1 is in its stable state (operating at point 1, FIGURE 2), transistor $Q_1$ is highly conductive. Also, $D_2$ is forward biased and the voltage at point A is the same as at point B, namely in the order of zero volts.

Reference is made to FIGURE 3, and in particular to the negative pulse of voltage waveform $V_H$. When this pulse is impressed on input terminal H the load decreases to point 5, and then switches to point 2, FIGURE 2. From FIGURES 1 and 2 it is apparent that voltage across the negative resistance device is also the voltage across the emitter base diode of transistor $Q_1$. Now, as a result of the application of the negative pulse of voltage waveform $V_H$, the voltage represented by point 2, FIGURE 3, is applied across the emitter-base diode of transistor $Q_1$. This voltage is insufficient to maintain transistor $Q_1$ conductive. Since transistor $Q_1$ is non-conductive the potential at point A, FIGURE 1, will rise exponentially with an initial slope of $$\frac{12\left(\frac{R_4}{R_1+R_4}\right)}{\left(\frac{R_1R_4}{R_1+R_4}\right)C_1}$$

At the time that the potential at point A reaches the magnitude $I_{peak}R_4$ volts (where $I_{peak}$ is the peak current of the negative resistance device as represented in FIGURE 2 and $R_4$ is the resistance of resistor $R_4$) the operating point of the circuit of FIGURE 1 will switch from point 3 to point 4. In other words, the tunnel diode $D_1$ of FIGURE 1 will switch from point 3 to point 4, FIGURE 2, and place a substantial voltage across the emitter-base diode of transistor $Q_1$. This voltage causes transistor $Q_1$ to become highly conductive and the potential at point B falls below the potential at point A, FIGURE 1. This causes the potential stored in capacitor $C_1$ to be discharged through the low impedance path of forward biased diode $D_2$ and highly conductive transistor $Q_1$. Hence the potential at point A falls exponentially with an effective initial slope of $$\frac{I_pR_4}{(R_{D2}+R_{Q1})C_1}$$

where $R_{D2}$ is the effective resistance of forward bias diode $D_1$, where $R_{Q1}$ is the effective reisistance of conductive transistor $Q_1$, and where $C_1$ is the capacitance of capacitor $C_1$. Thus, the monostable circuit returns to its stable or "quiescent" state represented by operating point 1 of FIGURE 2.

Referring to FIGURE 3 it will be seen that in response to the negative pulse of input waveform $V_H$, the potential at point A, ($V_A$), i.e., across the capacitor $C_1$, begins to rise with a time constant of $$\left(\frac{R_1R_4}{R_1+R_4}\right)C_1$$

This rise in voltage at point A closely approaches a ramp function. At the same instant that the potential at point A, represented by $V_A$ in FIGURE 2, begins to rise, the potential at point B, represented by $V_B$ in FIGURE 2, rises with a very short rise time, from approximately zero volts to +12 volts. When the potential at point A is equal in magnitude to $I_{peak}R_4$, where $I_{peak}$ is the peak current of the tunnel diode as shown in FIGURE 2, the potential at point A falls rather sharply with a time constant of $(R_{D2}+R_{Q1})\ C_1$. The potential at point B, waveform $V_B$, falls very sharply when the potential at point A reaches a magnitude equal to $I_{peak}R_4$. Thus it is apparent that the output pulse of waveform $V_B$ has very fast rise and fall times. The duration of the output pulse is T units of time. This pulse width has an inordinate degree of stability since the parameters $R_1$, $R_4$, $C_1$, and $I_{peak}$ may be chosen with an accuracy of better than 1%.

FIGURE 4 discloses an astable circuit according to the invention. Transistor $Q_1$ is shown as being of the NPN junction type having an emitter 13, base 12 and collector 11. Negative resistance device $D_1$ is connected between the base 12 and emitter 13 of transistor $Q_1$. The series circuit of diode $D_2$, resistor $R_5$ and resistor $R_4$ is connected between the base 12 and collector 11 of transistor $Q_1$. A switch 5, and a capacitor, or energy storage device $C_1$ are serially connected between the juncture of resistors $R_4$ and $R_5$ and the emitter 13 of transistor $Q_1$. A source of positive potential $E_{bb}$ is connected via resistor $R_3$ to collector 11 of transistor $Q_1$ and via resistor $R_2$ to base 2 of transistor $Q_1$. A resistor $R_1$ is connected between said source of positive potential and said juncture of resistors $R_5$ and $R_4$. The emitter 13 of transistor $Q_1$ is connected to ground or a source of suitable reference potential. An output terminal B is connected to the collector 11 of transistor $Q_1$.

The current versus voltage characteristic of the negative resistance device $D_1$ employed in the astable circuit of FIGURE 4 is represented by the curve labelled $k$ in FIGURE 5. This curve passes through labelled points 1, 2, 3, 4, and 5 as seen in FIGURE 2. Negative resistance device $D_1$ of FIGURE 4 may be essentially identical to negative resistance device $D_1$ of FIGURE 1. One such device which exhibits the current versus voltage characteristic represented by curve $k$ in FIGURES 2 and 5, respectively, is the Esaki or tunnel diode.

Reference is made to the graphical presentation of FIGURE 5 in conjunction with the astable circuit of FIGURE 4. Assume initially for purposes of explanation that the switch $S_1$, of FIGURE 4, is closed; then the following conditions exist: the negative resistance device is operating at point 1 of FIGURE 5; transistor $Q_1$ is non-conductive since the voltage across the emitter-base diode thereof, namely, the potential across negative resistance device $D_1$, is very small as seen from FIGURE 5; and capacitor $C_1$ has a charge of zero volts. In other words, with switch $S_1$ closed the intersection of load line $L_2$, arrived at by judicious choice of resistor $R_2$, and curve $k$, namely point 1, represents the operating state of the astable circuit of FIGURE 4.

Now assume at the instant in time $t_0$, as shown in FIGURE 6, that switch $S_1$ is opened; then the following conditions occur: the potential at junction B of FIGURE 4, namely $V_B$ of FIGURE 6, is $+E_{bb}$; and the potential across capacitor $C_1$ begins to rise from zero toward $$\left(\frac{R_4}{R_1+R_4}\right)E_{bb}$$

with a time constant of $$\tau_2=\left(\frac{R_1R_4}{R_1+R_4}\right)C_1$$

Referring to FIGURES 5 and 6 it will be seen that when the charge on capacitor $C_1$, which is the potential at junction A of FIGURE 4, is equal to $I_{peak}R_4$ the operating point will switch from point 3 to point 4. More accurately stated, the potential across the capacitor $C_1$ and at point A is equal to summation of the potential across $R_4$ and across $D_1$. However, for purposes of explanation, under the aforerecited conditions, the potential across $D_1$ may be neglected since it is very small compared to $I_{peak}R_4$, where $I_{peak}$ is the peak current of the tunnel diode. As seen from FIGURE 5, when operating at point 4 the emitter base diode is forward biased and transistor $Q_1$ becomes highly conductive. Reiterating, at this time, namely $t_1$, as viewed in FIGURE 6, $V_A=I_pR_4$ $V_B\approx 0$ since transistor $Q_1$ is highly conductive.

Further at time $t_1$, FIGURE 6, capacitor $C_1$ will begin to discharge toward the potential $$\left(\frac{R_T}{R_1+R_T}\right)E_{bb}$$

where $$R_T=\frac{R_4R_5}{R_4+R_5}$$

As seen from FIGURE 4, the potential at point A ($V_A$ of FIGURE 6) is the charge across capacitor $C_1$. The operating point of the negative resistance device $D_1$ will traverse the curve $k$ from point 4 to point 5 as capacitor $C_1$ discharges from $I_{peak}R_4$ volts to $I_vR_4$ volts, where $I_v$ is the valley current of the tunnel diode as shown in FIGURE 5. The operating point will then switch from point 5 to point 2, FIGURE 5. A complete cycle of the oscillator has now been completed, i.e., the tunnel diode traversing the path from point 2 to point 3, from point 3 to point 4, from point 4 to point 5, and from point 5 to point 2. This cycle will be repeated with attendant voltage variations $V_A$ and $V_B$ of FIGURE 6 until switch $S_1$ is closed when the circuit will revert to point 1. In other words, once the astable circuit of FIGURE 5 has been set into oscillation the point 1 is no longer a part of the cycle.

To assure a full understanding of the operation of the astable circuit of FIGURE 5, the operation of the circuit for the time interval $t_2$ to $t_3$ will be explained. At time $t_2$, FIGURE 6, the following conditions exist: the potential at point A, FIGURE 4, is $V_A=I_vR_4$=volts charge of $C_1$; the voltage across the tunnel diode is very small since the tunnel diode is operating at point 2; transistor $Q_1$ is non-conductive since the voltage across the emitter-base diode thereof is very small; $V_B=E_{bb}$, since transistor $Q_1$ is non-conductive; and capacitor $C_1$ will begin to charge to $$\left(\frac{R_4}{R_1+R_4}\right)E_{bb}$$

with a time constant of $$\tau_2=\left(\frac{R_1R_4}{R_1+R_4}\right)C_1$$

The operating point of the tunnel diode will move from point 2 toward point 3 as $C_1$ charges toward the potential $$\frac{R_4E_{bb}}{R_1+R_4}$$

volts. When $V_A=I_{peak}R_4$, that is, the charge of capacitor $C_1$ is $I_{peak}R_4$ volts, the tunnel diode is operating at point 3 of FIGURE 5. At this time, namely $t_3$ of FIGURE 6, the tunnel diode will switch from point 3 to point 4. At time $t_3$ (for practical purposes since a tunnel diode switches very rapidly) the tunnel diode is at point 4 and the transistor $Q_1$ is highly conductive since its emitter-base diode is appreciably forward biased. Thus at time $t_3$, $V_B=0$. The astable circuit will now function between the times $t_3$ to $t_4$ (not shown) in a manner identical to its action in the time interval $t_1$ to $t_2$ explained earlier. Thus, the astable circuit will continue to function in a cyclic manner with the tunnel diode successively traversing the path of operation (defined by operating points, FIGURE 5) 2 to 3, 3 to 4, 4 to 5, and 5 to 2. As is apparent from the foregoing explanation time $t_1$ to $t_2$ elapses in moving from point 4 to point 5, an infinitesimal amount of time elapses in switching from point 5 to point 2, time $t_2$ to $t_3$ elapses in moving from point 2 to point 3, and an infinitesimal amount of time elapses in switching from point 3 to point 4.

Now referring to FIGURE 6, it will be seen that: the potential $V_A$ drops with a time constant $$\tau_1=C_1\left(\frac{R_1R_4R_5}{R_1R_4+R_1R_5+R_4R_5}\right)$$

from $I_{peak}R_4$ volts to $I_vR_4$ volts in the time interval $t_1$ to $t_2$; the potential $V_A$ rises with a time constant $$\tau_2=C_1\left(\frac{R_1R_4}{R_1+R_4}\right)$$

from $I_vR_4$ volts to $I_{peak}R_4$ volts in the time interval $t_2$ to $t_3$; and $V_B\approx 0$ during the time interval $t_1$ to $t_2$ and $V_B=E_{bb}$ during the time interval $t_2$ to $t_3$. The foregoing complete cycle of the astable circuit of FIGURE 5 will be successively repeated. Hence the circuit of FIGURE 5 functions as a free running oscillator.

The following relationships, referring to FIGURES 4, 5, and 6, are also readily established:

where $$\tau_1=C_1\left(\frac{R_1R_4R_5}{R_1R_4+R_1R_5+R_4R_5}\right);\ \tau_2=C_1\left(\frac{R_1R_4}{R_1+R_4}\right)$$

$$;\ R_T\frac{R_4R_5}{R_4+R_5}$$

$$e_A(t_1\to t_2)=\left(E_{bb}\frac{R_T}{R_1+R_T}-I_pR_4\right)\left(1-e^{-t/\tau_1}\right)+I_pR_4$$

$$\therefore t_2-t_1=T_1=-\tau_1\log_e\left(\frac{-I_vR_4+I_{peak}R_4}{E_{bb}\frac{R_T}{R_1+R_T}-I_pR_T}+1\right)$$

$$e_A(t_2\to t_3)=\left(1-e^{-t/\tau_2}\right)\left(E_{bb}\frac{R_4}{R_1+R_4}-I_vR_4\right)+I_vR_4$$

$$\therefore t_3-t_2=T_2=-\tau_2\log_e\left(\frac{I_pR_4+I_vR_4}{E_{bb}\frac{R_4}{R_1+R_4}-I_vR_4}+1\right)$$

Although NPN junction transistors have been shown, it is to be realized that other types of switching devices may be combined with the negative resistance device in accordance with the teaching of applicant's invention to obtain the desired result. For example, it is submitted as apparent, in view of the preceding full description of the invention, that PNP transistors could be employed.

Likewise, although the Esaki or tunnel diode has been described as being a preferred type of device for the negative resistance element of the invention, it is to be understood that other devices exhibiting the requisite negative resistance characteristic may be employed.

Also, although switch $S_1$, FIGURE 4, is shown merely as a set of contacts, any one of a number of switches well known in the art may be employed.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A monostable device for rendering output pulses having improved pulse width stability and improved rise and fall times, said monostable device consisting of: a transistor having an emitter, base, and collector; a tunnel diode connected between said base and said emitter of said transistor; a series circuit consisting of a diode and a first resistor connected between said base and said collector of said transistor; a capacitor connected between said emitter of said transistor and the juncture of said diode and said first resistor; a source of potential; a second resistor connected between said source of potential and said juncture of said diode and said first resistor; a third resistor connected between said source of potential and said base of said transistor; a fourth resistor connected between said source of potential and said collector of said transistor; an input terminal connected via a fifth resistor to said base of said transistor; and an output terminal connected to said collector of said transistor.

2. An astable device for rendering output pulses having improved pulse width stability and improved rise and fall times, said astable device consisting of: a transistor having an emitter, base, and collector; a tunnel diode connected between said base of said emitter of said transistor; a source of potential; first and second resistors serially connected between said source of potential and said base of said transistor; a third resistor serially connected between said base of said transistor and said source of potential; a fourth resistor connected between said source of potential and said collector of said transistor; a series circuit consisting of a fifth resistor and a diode connected between said collector of said transistor and said juncture of said first and second resistors; a capacitor connected between said emitter of said transistor and said juncture of said first and second resistors.

3. A monostable device for rendering output pulses having improved pulse width stability and improved rise and fall times, said monostable device comprising: a transistor having an emitter, base, and collector; a two terminal solid state negative resistance device connected between said base and said emitter of said transistor; a series circuit including a unidirectional device and a first resistor connected between said base and said collector of said transistor; an energy storage device connected between said emitter of said transistor and the juncture of said unidirectional device and said first resistor; a source of potential; a second resistor connected between said source of potential and said juncture of said unidirectional device and said first resistor; a third resistor connected between said source of potential and said base of said transistor; and a fourth resistor connected between said source of potential and said collector of said transistor.

4. An astable device for rendering output pulses having improved pulse width stability and improved rise and fall times, said astable device comprising: a transistor having an emitter, base, and collector; a two terminal solid state negative resistance device connected between said base and said emitter of said transistor; a source of potential; first and second resistors serially connected between said source of potential and said base of said transistor; a third resistor serially connected between said base of said transistor and said source of potential; a fourth resistor connected between said source of potential and said collector of said transistor; a series circuit including a fifth resistor and a unidirectional device connected between said collector of said transistor and said juncture of said first and second resistors; an energy storage device connected between said emitter of said transistor and said juncture of said first and second resistors.

5. An oscillator for generating output pulses having improved pulse width stability and extremely short fall and rise times, comprising: an output circuit; a transistor connected to said output circuit; means for biasing said transistor in first and second states, said means including a negative resistance device having at least first and second stable resistance values; an energy storage device connected to said biasing means; means for charging said energy storage device when said transistor is in its first state to a predetermined voltage to cause said negative resistance device to assume its second stable resistance value thereby in turn, causing said transistor to change from its first state to its second state; and unidirectional conductive means connected between said energy storage device and said output circuit, so that said transistor causes said unidirectional conductive means to be biased to nonconduction when said transistor is in said first state and to be biased to conduct when said transistor is in said second state, whereby, the charging of said energy storage device is effectively isolated from said output circuit.

6. An oscillator adapted to generate output pulses having improved pulse width stability comprising: an output circuit; a transistor connected to said output circuit; bias means including a voltage responsive negative resistance device for normally biasing said transistor into a conductive state, said negative resistance device being responsive to an input pulse to bias said transistor into a non-conductive state; an energy storage device connected to said bias means; unidirectional conductive means connected between said output circuit and said energy storage device so as to isolate said energy storage device when said transistor is in said non-conductive state; means connected to charge said energy storage device over a preselected interval starting when said device is isolated by said unidirectional conductive means, to a voltage which returns said negative resistance device to said normal bias condition and thereby biases said transistor in said conductive state; whereby said energy storage device is rapidly discharged through said transistor producing an output pulse having a fall time of duration equal to the discharge time of said energy storage device.

7. An oscillator adapted to generate output pulses having improved pulse width stability comprising: an output circuit; a transistor connected to said output circuit; bias means including a tunnel diode for normally biasing said transistor in a conductive state, said tunnel diode being responsive to an input pulse to bias said transistor into a non-conductive state; an energy storage device connected to said bias means; unidirectional conductive means connected between said output circuit and said energy storage device for isolating said energy storage device when said transistor is in said non-conductive state; means connected to charge said energy storage device over a preselected interval starting when said device is isolated by said unidirectional conductive means, to a voltage which causes said tunnel diode to return said transistor to said conductive state; whereby said transistor being rendered conductive, causes said energy storage device to rapidly discharge.

References Cited

UNITED STATES PATENTS

| | | | |
|---|---|---|---|
| 3,018,392 | 1/1962 | Jones et al. | 307—88.5 |
| 3,061,790 | 10/1962 | Theriault | 307—88.5 |
| 3,092,784 | 6/1963 | Watters | 307—88.5 |
| 3,094,631 | 6/1963 | Davis | 307—88.5 |
| 3,106,649 | 10/1963 | Johnson | 307—88.5 |
| 3,115,584 | 12/1963 | Yao | 307—88.5 |

ARTHUR GAUSS, *Primary Examiner.*

H. DIXON, *Assistant Examiner.*